(12) United States Patent
Ogawa (10) Patent No.: US 7,016,126 B2
(45) Date of Patent: Mar. 21, 2006

(54) OPTICAL ELEMENT HOLDING SYSTEM IN PROJECTION OPTICAL SYSTEM

(75) Inventor: Masahiko Ogawa, Ageo (JP)

(73) Assignee: Canon Kabushiki Kaisha, Tokyo (JP)

( * ) Notice: Subject to any disclaimer, the term of this patent is extended or adjusted under 35 U.S.C. 154(b) by 21 days.

(21) Appl. No.: 10/461,843

(22) Filed: Jun. 13, 2003

(65) Prior Publication Data

US 2004/0257680 A1    Dec. 23, 2004

(30) Foreign Application Priority Data

Jun. 14, 2002    (JP)    ............................. 2002-174904

(51) Int. Cl.
  *G02B 7/02*    (2006.01)

(52) U.S. Cl. ........................ 359/819; 359/822; 359/649

(58) Field of Classification Search ................ 359/819, 359/809, 811, 813, 815, 822, 443, 448, 649–51; 356/603, 391; 353/28–33; 349/57
See application file for complete search history.

(56) References Cited

U.S. PATENT DOCUMENTS

| 5,864,433 | A | 1/1999 | Takahashi et al. | .......... 359/637 |
| 5,973,863 | A | 10/1999 | Hatasawa et al. | ........... 359/823 |
| 6,179,208 | B1 * | 1/2001 | Feng | ...................... 235/472.01 |
| 2002/0163738 | A1 * | 11/2002 | Yoshihara | ................... 359/711 |

FOREIGN PATENT DOCUMENTS

| JP | 10-27743 | 1/1998 |
| JP | 10-54932 | 2/1998 |

* cited by examiner

*Primary Examiner*—Jordan M. Schwartz
*Assistant Examiner*—Jessica Stultz
(74) *Attorney, Agent, or Firm*—Morgan & Finnegan, LLP (57) ABSTRACT

Disclosed is a simple and compact optical element holding system in a projection optical system which enables correction of astigmatism without causing comatic aberration. The holding system includes a relative angle adjusting system for tilting one of at least two optical elements with respect to an optical axis, and a tilt angle adjusting system for tilting the at least two optical elements integrally, by the same amount as and in an opposite direction to the tilt direction of the relative angle adjusting system, with respect to the optical axis and separately from the relative angle adjusting system.

18 Claims, 6 Drawing Sheets

OPTICAL ELEMENT HOLDING SYSTEM IN PROJECTION OPTICAL SYSTEM

FIELD OF THE INVENTION AND RELATED ART

This invention relates to an optical element holding system in a projection optical system, an optical adjusting method based on such holding system, an exposure apparatus having such holding system, an exposure method and a device manufacturing method. Particularly, the present invention concerns an optical element holding system in a projection optical system for use in manufacture of devices such as semiconductor chips (IC or LSI), image pickup devices (CCD, for example), or display devices (liquid crystal panel, for example), an optical adjusting method based on such holding system, an exposure apparatus having such holding system, an exposure method and a device manufacturing method.

Conventionally, in lens holding systems, more particularly, lens holding systems for a projection optical system used in a semiconductor exposure apparatus, generally, for satisfying the performance, the projection optical system is constituted by a plurality of lens elements. In every single lens element, deformation can occur due to a manufacturing error or lens holding. In order to acquire total performance of the projection optical system, aberrations produced in this projection optical system have to be corrected.

Further, in scan type exposure apparatuses, illumination light for illuminating a mask has a cross-section of rectangular shape or arcuate shape, being elongated in a direction (orthogonal direction) orthogonal to the scan direction. As a result of this, imaging light generated from a pattern of the mask has a cross-sectional shape being elongated in the orthogonal direction. When such imaging light enters a projection optical system, a refractivity distribution to be produced as a result of absorption of a portion of the imaging light by lenses of the projection optical system, or the magnitude of deformation of a refractive surface, would be different between in the scan direction and in the orthogonal direction. If this occurs, the best focus position (best imaging position) is different with a pattern which mainly diffract the illumination light in the orthogonal direction to project diffracted light to the projection optical system (hereinafter, this being referred to as "astigmatism"). Such aberration has to be corrected.

As a solution for such problem, U.S. Pat. No. 5,864,433 (Japanese Laid-Open Patent Application No. 10-27743) shows a projection exposure apparatus in which two plane-parallel plates for correction of astigmatism are tilted in opposite directions, with respect to an optical axis, and by the same amount.

Also, U.S. Pat. No. 5,973,863 (Japanese Laid-Open Patent Application No. 10-54932) shows a structure in which, for aberration correction, a lens element is tilted by use of coma washer, actuator and piezoelectric device.

However, in the lens element tilting mechanism described above, the correction mechanism for astigmatism correction and for comatic aberration correction is not separated. This causes a problem that, when astigmatism correction is performed, the comatic aberration of the projection optical system is changed thereby. Namely, for correction of astigmatism, the two plane-parallel plate lenses must be tilted by the same amount and in opposite directions, with respect to the optical axis. If the tilt amounts of the two plane-parallel plate lens elements are not the same, with respect to the optical axis, comatic aberration occurs. Particularly, as compared with the tilt amounts of the two plane-parallel plate lens elements for correction of the astigmatism, the tilt amount causing comatic aberration is very sensitive.

Where adjustment based on coma washer or drive of piezoelectric device is used, three-axis control to the two plane-parallel plate lenses, namely, six-axis control, must be done to assure that they are tilted in desired directions by the same amount. More specifically, it is necessary that the adjustment amount for tilting a single plane-parallel plate lens element is exactly the same as the adjustment amount for tilting the remaining plane-parallel plate lens element. The tilt precision is therefore very difficult to accomplish. If the tilt precision of each plane-parallel plate lens element with respect to the optical axis is adjusted to be coarse to fit the astigmatism correction precision level, due to the difference in tilt sensitivity between the astigmatism and coma, a remaining tilt difference between the two plane-parallel plates with respect to the optical axis would cause comatic aberration.

Furthermore, where a piezoelectric device or the like is used, three-axis control to the two plane-parallel plates, namely, six-axis control, is necessary, and this necessitates enlargement in size of the mechanism. Particularly, as regards plane-parallel plates, for economic reason, a lens element of smaller diameter is desired. Also, because of easiness in attaining the precision at the polished surface, it is desired to place the lens element at the substrate side of the projection optical system. However, in many cases, an alignment measuring unit or the like of a semiconductor exposure apparatus is placed in the neighborhood of the substrate surface. Therefore, it is difficult to secure the space. The increase in size of the mechanism is thus really a large problem.

SUMMARY OF THE INVENTION

It is accordingly an object of the present invention to provide a simple and compact optical element holding system in a projection optical system which is capable of solving at least one of the problems described hereinbefore and which surely enables correction of astigmatism without causing comatic aberration.

It is another object of the present invention to provide an optical adjustment method based on such holding system, an exposure apparatus having such holding system, an exposure method or a device manufacturing method.

In accordance with an aspect of the present invention, there is provided an optical element holding system in a projection optical system, comprising: at least two optical elements; relative angle adjusting means for tilting one of said at least two optical elements with respect to an optical axis; and tilt amount adjusting means for tilting said at least two optical elements integrally, by the same amount as and an in an opposite direction to the tilt direction defined by said relative angle adjusting means, with respect to the optical axis and separately from said relative angle adjusting means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In one aspect of the present invention, as described above, an optical element holding system in a projection optical system comprises at least two optical elements, relative angle adjusting means for tilting one of said at least two optical elements with respect to an optical axis, and tilt amount adjusting means for tilting said at least two optical elements integrally, by the same amount as and an in an opposite direction to the tilt direction defined by said relative angle adjusting means, with respect to the optical axis and separately from said relative angle adjusting means. With this structure, one of the two optical elements can be tilted by the relative angle adjusting means with respect to the optical axis and, subsequently, the two optical elements can be tilted integrally with respect to the optical axis by the tilt amount adjusting means, by the same amount as and in an opposite direction to the tilt direction defined by the relative angle adjusting means. This enables that the angular adjustment through the relative angle adjusting means and the tilt amount adjustment through the tilt amount adjusting means is separated from each other. Therefore, astigmatism produced in the projection optical system can be corrected assuredly.

The lens holding system may be mounted rotatably with respect to the optical axis of the projection optical system. It enables correction of any astigmatism in an arbitrary direction, produced in the projection optical system.

The holding system may include first and second holding members for holding two optical elements, at three approximately 120-deg. equidistant positions along an outer periphery of the optical elements, wherein the holding positions of the first and second holding members may be mutually deviated by 60 deg. This is very effective to minimize the aberration to be produced by the holding self-weight deformation of the lens holding system.

In the first holding member, the level of one of the three holding positions may be made adjustable so as to tilt the optical element held by the first holding member relatively to the optical element held by the second holding member. This structure enables adjustment of the relative angle by changing the level only at a single location, without changing the holding levels all at the six locations on the two optical elements. The holding level changing means may comprise a tilt spacer or a piezoelectric device, for example, and it can provide a required tilt amount.

The lens holding system may be mounted demountably with respect to the projection optical system. This enables assured correction of astigmatism, without demounting the projection optical system from a projection exposure apparatus, in the process of or after the process of manufacturing the projection exposure apparatus.

The lens holding system may be mounted tiltably with respect to the optical axis of the projection optical system. By tilting two plane-parallel plates simultaneously with respect to the optical axis of the projection optical system, comatic aberration can also be corrected.

A projection exposure apparatus or a projection exposure method based on such lens holding system as described above may be constructed, and in that occasion, a projection exposure apparatus or a projection exposure method by which astigmatism can be corrected assuredly is provided.

Further, by use of the relative angle adjusting means, one optical element held by the first holding member, may be tilted relatively to another optical element held by the second holding member. Also, the tilt of the two optical elements may be taken back integrally with respect to the base member and by an amount corresponding to a half of the desired angle, thereby to tilt them in opposite directions with respect to the optical axis of the projection optical system. When such optical adjusting method is applied to a projection exposure apparatus or method, a projection exposure apparatus or method by which astigmatism produced in an exposure process can be detected and corrected assuredly.

The optical elements may be at least two plane-parallel plate lens elements having approximately the same refractivity and thickness. With this structure and where one plane-parallel plate lens element is tilted and thereafter the two plane-parallel lens elements are tilted integrally with respect to the optical axis and in opposite direction, the tilt angle adjustment through the tilt angle adjusting means for adjusting the comatic aberration correction amount and the adjustment through the adjusting means for tilting the two plane-parallel plates, correcting remaining comatic aberration, by the same amount an in mutually opposite directions with respect to the optical axis, can be done completely separately from each other. As a result, for the astigmatism correction, it can be adjusted separately from the correction of comatic aberration which is more sensitive to tilt, than the astigmatism. Therefore, these aberrations can be corrected more precisely. Further, the plates can be tilted in opposite directions with respect to the optical axis, more precisely, such that the astigmatism produced in the projection optical system can be corrected assuredly. Additionally, since the astigmatism can be corrected through three-level adjustment control such as astigmatism correction amount adjustment (relative angle adjustment of two plane-parallel plates)→remaining coma correction (angular adjustment of two plane-parallel plates with respect to the optical axis)→phase adjustment with respect to astigmatism production direction. Therefore, astigmatism correction is assured with a lens holding system of compact structure and easy controllability.

The tilt angle and tilt direction of two plane-parallel plates may be changed in accordance with the result of detection made through detecting means. This enables automatic correction of astigmatism, produced during the exposure process, through a compact structure and simple control.

Preferred embodiments of the present invention will now be described with reference to the attached drawings.

[Embodiment 1]

A first embodiment of the present invention will be described in conjunction with FIGS. 1–3 and 5.

Figure 1:
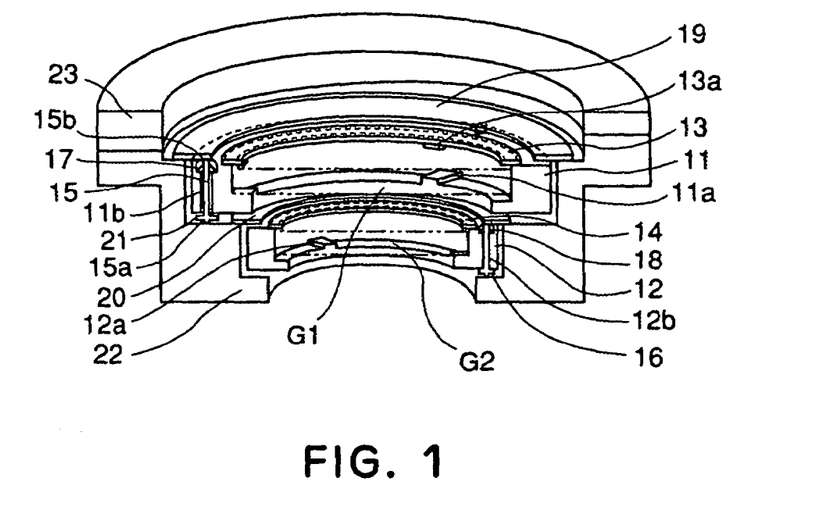
FIG. 1 is a perspective and sectional view, showing the structure of a lens holding system according to a first embodiment of the present invention.
Figure 2:
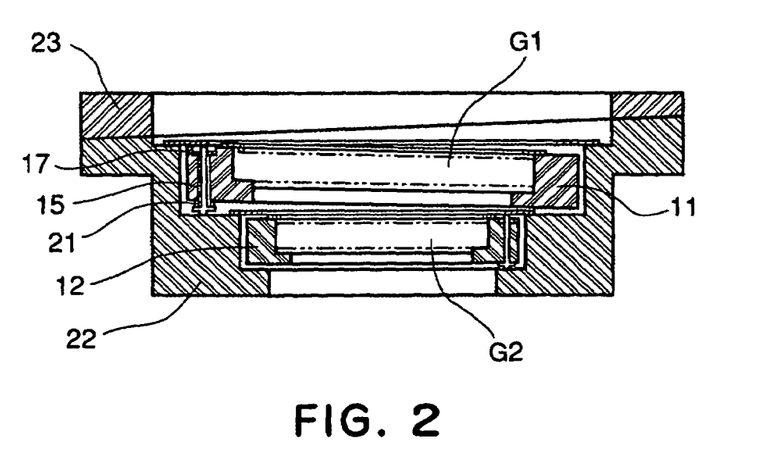
FIG. 2 is a sectional view, illustrating the state in operation of the lens holding system of the first embodiment.
Figure 3:
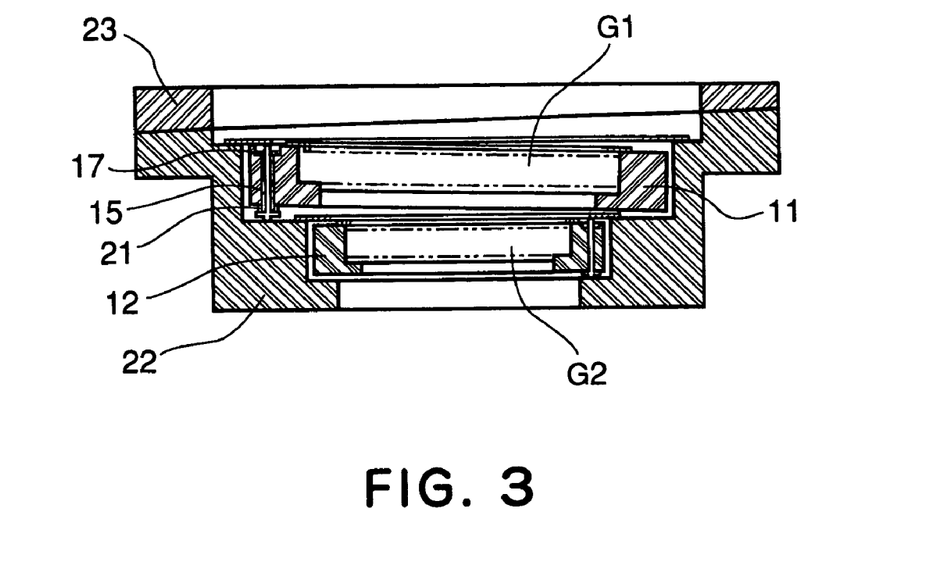
FIG. 3 is a sectional view, illustrating the state at completion of the operation in the lens holding system of the first embodiment.
Figure 5:
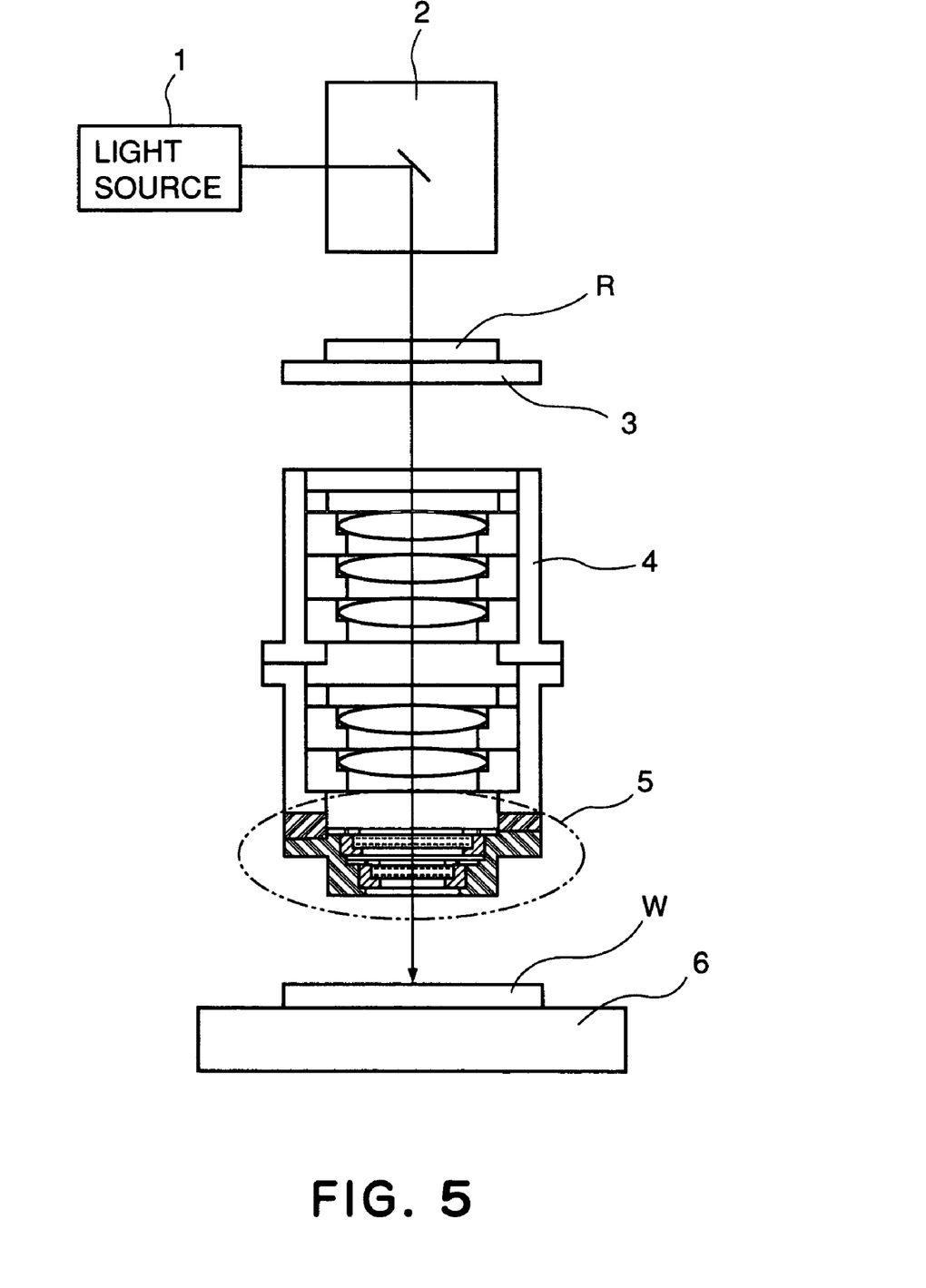
FIG. 5 is a schematic view, illustrating the structure of a projection exposure apparatus which uses a lens holding system according to the first embodiment of the present invention.

FIGS. 1–3 are sectional views, showing the structure of a lens holding system according to the present invention. FIG. 5 is a schematic and sectional view of a projection exposure apparatus having such a lens holding system incorporated therein.

In the projection exposure apparatus of FIG. 5, denoted at 1 is an exposure light source, and denoted at 2 is an illumination optical system for illuminating a predetermined region of a reticle R with illumination light from the exposure light source 1. Specifically, the illumination optical system 2 illuminates the reticle R which is held on a reticle stage 3. The light passing through the reticle R is directed by a projection optical system 4 onto a wafer W, placed on a wafer stage 6, by which a pattern of the reticle R is projected and transferred to an exposure region on the wafer.

The projection optical system 4 includes a lens holding system 5 having two plane-parallel plates of approximately the same thickness and same refractivity, at the wafer W side.

Referring to FIG. 1, details of the lens holding system 5 will be described.

FIG. 1 is a perspective and sectional view of the lens holding system, as viewed obliquely from the above. In the drawing, two plane-parallel plates having approximately the same thickness and refractivity are depicted by dash-and-dots lines at G1 and G2, in an order from the exposure light source side, for better understanding. The plane-parallel plate G1 is held by a lens holding member 11 (hereinafter, "G1-cell") while the plane-parallel plate G2 is held by a lens holding member 12 (hereinafter, "G2-cell"). As regards the manner of holding the plane-parallel plate, in the case of the plane-parallel plate G1, it is mounted on protrusions 11a of the G1-cell 11 and is pressed and secured by protrusions 13a, provided on a G1 pressing ring 13.

In this embodiment, a leaf spring of annular shape is used as the G1 pressing ring 13 and, by setting the leaf spring flexure (deflection) amount constant, a predetermined force can be produced at the protrusion 13a. The G1-cell protrusions 11a are disposed outwardly of the effective diameter of the plane-parallel plate G1 (the diameter for passing the illumination light), and they are provided at three locations at regular pitch of 120 deg.

The protrusion 13a of the G1 pressing ring is disposed so that it comes to just above the G1-cell protrusion 11a. Thus, the plane-parallel plate G1 is held by being sandwiched between the G1-cell protrusion 11a and the pressing ring protrusion 13a.

In the case of the plane-parallel plate G2, like the case of plate G1, the plane-parallel plate G2 is held by being sandwiched between G2-cell protrusion 12a as illustrated and protrusion 14a provided on G2 pressing ring 14, similarly to the plane-parallel plate G1. What differs from G1 is that the phase positions of the G2-cell protrusion 12a and the G2 pressing ring protrusion 14a are disposed at 60-deg. deviated positions relative to the G1-cell protrusion 11a and G1 pressing ring protrusion 13a.

Next, the manner of holding the G1 cell and G2-cell, holding the G1 and G2, will be described.

Both of the G1-cell 11 and G2-cell 12 are held by a correcting barrel 22. There is G1 holding pin 15 mounted to a throughbore 11b, provided in the G1-cell 11, by use of a G1 holding pin keeper 17. The G1 holding pin 15 and the G1 holding pin keeper 17 are interconnected by screw, for example, and they are mounted to the G1-cell 11. As regards the throughbore 11b, G1 holding pin 15 and the G1 holding pin keeper 17, like the above-described protrusions, there are three sets provided at three locations at regular pitch of 120 deg. Thus, at three points at the bottommost faces 15a of the G1 holding pins 15, the G1-cell is mounted to the correcting barrel 22.

At the topmost faces 15b of the G1 holding pins 15, a pressing force is applied by a G1-cell pressing ring 19. By applying a force to the topmost faces 15b of the G1 holding pins 15 from the above, the G1-cell 11 can be secured to the correcting barrel 22. In this embodiment, a leaf spring of annular shape is used as the G1-cell pressing ring 19 and, by setting the leaf spring flexure amount constant, a predetermined force is produced at the G1 holding pin topmost faces 15b.

In the case of the G2-cell 12, by means of throughbores 12b provided in the G2-cell 12, G2 holding pins 16, G2 holding pin keepers 18, and a G2-cell pressing ring 20, the G2 cell 12 is held secured to the correcting barrel 22 at three locations, like the G1-cell 11. What differs from G1 cell is that the phase positions of the G2-cell throughbores 12b, G2-cell holding pins 16, and the G2-cell pressing ring 18, are disposed at 60-deg. deviated positions relative to the G1-cell throughbores 11b, G1-cell holding pins 15, and G1-cell pressing ring 17.

Further, although in this embodiment the plane-parallel plate G2 is fixed to the correcting barrel 22 by way of the G2-cell 12, it may be directly held by the correcting barrel 22. As regards the pressing rings 13, 14, 19 and 20 of ring-like shape, used in this embodiment, they are attached to the correcting barrel 22 by mean of a screw (not shown), for example. In FIG. 1, there are a tilt spacer 21 and an annular wedge 23, which will be described below with reference to FIGS. 2 and 3 in conjunction with the explanation of the operational mechanism.

Now, referring to FIGS. 2 and 3, the operational mechanism for tilting the two plane-parallel plates G1 and G2 in mutually opposite directions with respect to the optical axis and by the same amount, will be explained.

FIG. 2 illustrates the state in which, as compared with FIG. 1, only G1 is tilted with respect to the optical axis. Initially, only the plate G1 is tilted with respect to the optical axis by plane-parallel plate tilt amount for the G1 and G2, required for correction of astigmatism. By inserting a tilt spacer 21 into between the G1-cell 11 and the G1-cell holding pin 15, the plate G1 and G1-cell 11 can be tilted with respect to the correcting barrel 22 and the optical axis. Here, the tilt spacer 21 can be inserted at any position of the G1-cell holding pins 15, provided at three locations. Further, this may be done by inserting a tilt spacer into between the G2-cell 12 and the G2-cell holding pin 16. The adjustment may well be done at only one location, among the total six adjustable locations for the G1 cell and G2 cell. With the insertion of this tilt spacer 21, one of the plane-parallel plates bears a desired tilt amount with respect to the optical axis, as required for the astigmatism correction. The tilting operation mechanism is not limited to use of a tilt spacer as described above. A desired and required tilt amount may be produced by using a piezoelectric device, for example.

FIG. 3 is a sectional view, illustrating the state in which two plane-parallel plates G1 and G2 are being finally tilted with respect to the optical axis, in mutually opposite directions and by the same amount. By rotating the correcting barrel 22 relatively to the annular wedge 23 from the state shown in FIG. 2, the state shown as shown in FIG. 3 can be achieved. The abutment faces of the annular wedge 23 and the correcting barrel 22 are attached, with respective angles, by use of a screw (not shown), for example. In the initial state of FIG. 2, a large-thickness portion of the annular wedge 23 and a small-thickness portion of the correcting barrel 22 are attached to each other. Here, by rotating the correcting barrel 22 relative to the annular wedge 23, the correcting barrel as a whole is tilted with respect to the optical axis. By setting the position of the smallest-thickness portion of the correcting barrel 22 to be coincident with the phase at the location where the tilt spacer 21 is inserted when G1 is tilted, the correcting barrel 22 can be tilted with respect to the optical axis, about a central axis being parallel to the tilt central axis as G1 is tilted. In this manner, G1 and G2 can be tilted integrally with respect to the optical axis. By taking G1 back to a desired tilt amount, both G1 and G2 can be tilted with respect to the optical axis, in opposite directions and by the same amount.

The above-described operation can be summarized as follows. The structure is such that: astigmatism correcting stage for adjusting the relative angle of G1 and G2, for adjustment of the amount of astigmatism correction, and comatic aberration correction adjusting stage for tilting G1 and G2 with respect to the optical axis by the same amount, can be carried out completely separately from each other. Here, since the lens holding system 5 can be rotatably mounted to the projection optical system 4, it can be attached so as to bear a largest tilt in the direction with respect to which the astigmatism is produced. As a result, astigmatism correction can be done in a desired direction and by a desired amount. Further, a wedge plate. (not shown) may be used, when the lens holding system 5 is attached to the projection optical system 4, so that two plates may be attached integrally. In such case, comatic aberration can also be corrected with respect to a desired direction and by a desired amount.

In this embodiment, two plane-parallel plate lens elements G1 and G2 as well as the lens holding members, that is, G1-cell and G2-cell, can be held at three points having a pitch of 120 deg. Thus, the structure can be held in the manner that keeps the optical performance for a long period and very stably. Additionally, by deviating the phases of the two-plate holding positions by 60 degrees, self-weight deformation of bell-like shape which otherwise would be produced when the lens elements or cells are held, can be cancelled by the two plane-parallel plates. Namely, in the two plane-parallel plates, apparently, the holding deformation of a lens itself can be substantially disregarded. Thus, for a certain production amount of astigmatism, it can be corrected exactly as calculated, on the basis of the tilt amount of the two plane-parallel plates. Yet, production of any other aberration resulting from the astigmatism correction can be minimized. Further, since the astigmatism can be corrected through simple control having three stages of (i) tilting one plane-parallel plate, (ii) tilting two plates at once, and (iii) rotating it in accordance with the aberration correcting direction and then mounting it. Therefore, the correcting mechanism itself required can be made very compact.

[Embodiment 2]

A second embodiment of the present invention will now be described with reference to FIGS. 4 and 6.

Figure 4:
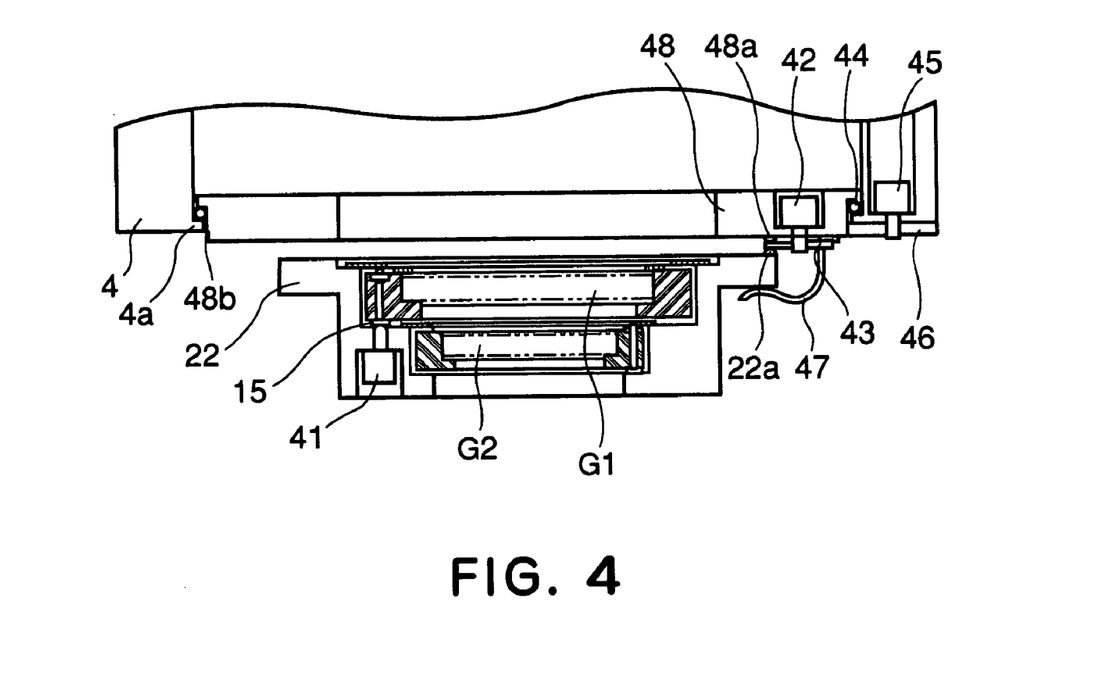
FIG. 4 is sectional view, showing the structure of a lens holding system according to a second embodiment of the present invention.

FIG. 4 is a sectional view of a lens holding system, which best illustrates the features of the present invention. FIG. 6 is a schematic and sectional view of a projection exposure apparatus having such lens holding system incorporated therein.

First, the projection exposure apparatus of FIG. 6 will be described. Like numerals as those of FIG. 5 of the first embodiment are assigned to corresponding components, and duplicate explanation is omitted.

Figure 6:
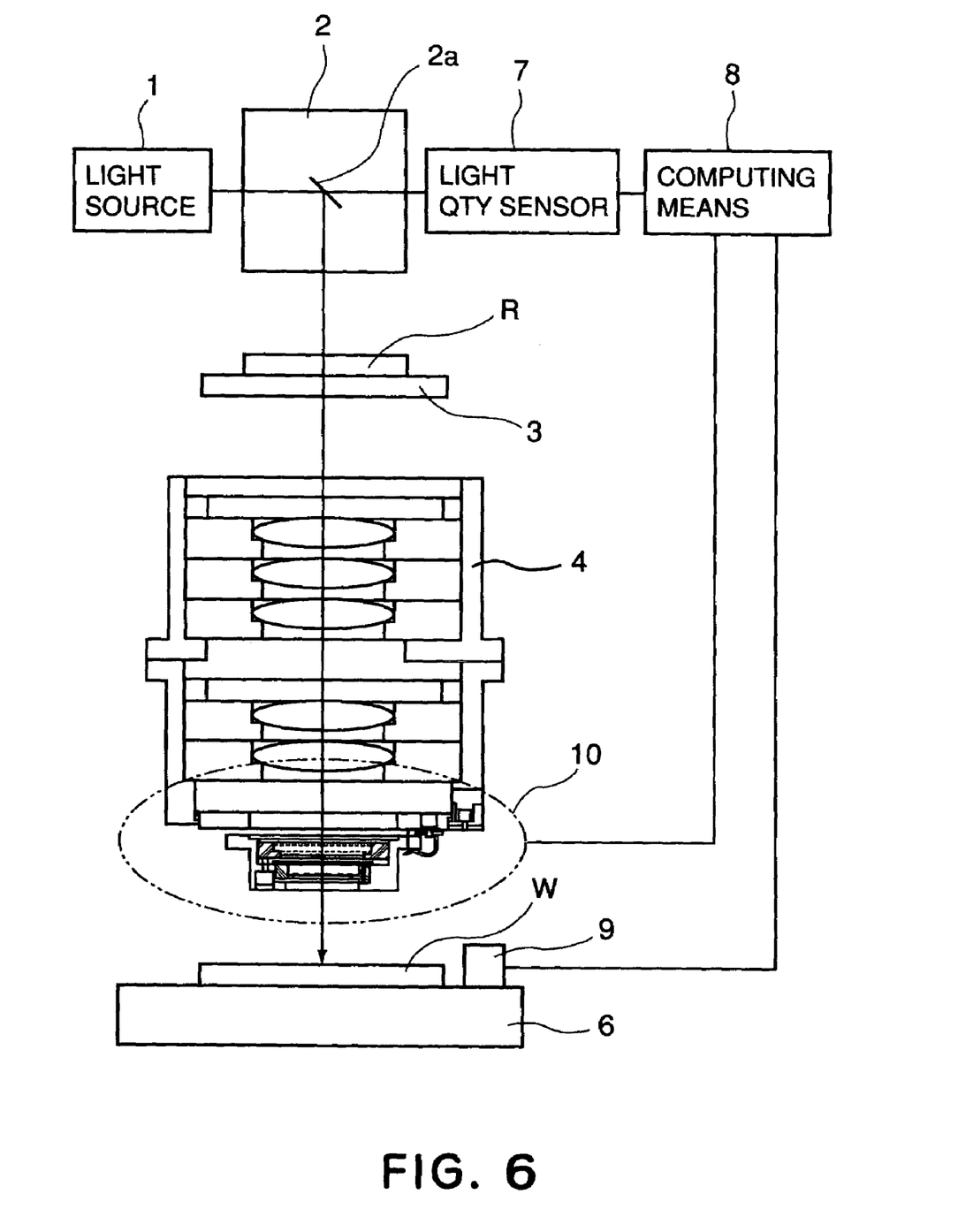
FIG. 6 is a schematic view, illustrating the structure of a projection exposure apparatus which uses a lens holding system according to the second embodiment of the present invention.

In FIG. 6., a projection optical system 4 includes a lens holding system 10 having two plane-parallel plates of approximately the same thickness and same refractivity, at the wafer W side. Denoted at 2a is a half mirror disposed in an illumination optical system 2, for extracting a portion of illumination light. The extracted portion of the illumination light impinges on a light quantity sensor 7, whereby the exposure amount on the wafer W is monitored. Denoted at 9 is an illuminance measuring device which is mounted on a wafer stage, and denoted at 8 is computing means for calculating the quantity of light impinging on the projection optical system 4 per unit time and also for predicting a change in optical characteristic of the projection optical system 4.

As the exposure starts, the projection optical system 4 absorbs a portion of light, such that the temperature thereof changes and the optical characteristic of the projection optical system 4 changes. In addition to aberration components such as focus and magnification as a matter of course, where the exposure region of the mask has an oblong shape, astigmatism is produced in response to the exposure. Production of aberration and aberration correctability based on two plane-parallel plates are known in the art, as disclosed in Japanese Laid-Open Patent Application No. 10-27743, and it applies also to the present embodiment. More specifically, the astigmatism as detected by the computing means 8 can be well corrected in accordance with the result of detection, by tilting the two plane-parallel plates with respect to the optical axis, in mutually opposite directions and by the same amount. This embodiment will further be explained, in conjunction with FIG. 4 and with reference to an astigmatism correcting mechanism for automatically tilting two plane-parallel plates in accordance with the result of astigmatism correction, detected by the computing means 8.

In regard to FIG. 4, the order of tilting the two plane-parallel plates is the same as the first embodiment. Initially, in order to tilt G1 with respect to the optical axis, an actuator 41 is used to push one of G1-cell holding pins 15, mounted at three locations of the G1-cell 11, thereby to tilt G1 integrally with the G1-cell 11. Subsequently, in order to tilt both G1 and G2 with respect to the optical axis, the correcting barrel 22 is tilted with respect to the optical axis. The correcting barrel 22 is mounted to a rotary plate 48 by means of leaf springs 47, provided on the outer periphery at 120-deg. pitch. At the locations where the leaf springs 47 are mounted, the correcting barrel is provided with protrusions 22a while the rotary plate 48 is provided with protrusions 48a. At two unshown locations, there are protrusions of spherical shape and being rotatable. At one protrusion at the illustrated location, there is s wedge-like rotary plate 43 sandwiched between the protrusions. Here, the wedge-like rotary plate 43 can be rotated by rotary drive of a motor 42, attached to the rotary plate 48. Through the rotation of the wedge-like rotary plate 43, the spacing between the protrusions 22a and 48a changes. Thus, the correcting barrel 22 tilts with respect to the rotary plate 48. Finally, in order to change the phase at the location of largest tilt amount of the two plane-parallel plates, the rotary plate 48 is rotated relative to the projection optical system 4. There are a plurality of rollers 44 arrayed circumferentially, at inner protrusions 4a of the projection optical system 4. The rotary plate 48 is mounted on the rollers 44. The rotary plate 48 is provided with a gear portion 48b formed at its outer circumference. Thus, with the rotation of the motor 45 mounted on the projection optical system 4, the gear 46 which is rotatable together with the motor 45 rotation is rotationally driven, such that the rotary plate 48 is rotated relatively to the projection optical system 4.

In accordance with the operation described hereinbefore, the lens holding system 10 functions to tilt two plane-parallel plates with respect to the optical axis, in mutually opposite directions and by the same desired amount, to tilt them in desired directions. Thus, astigmatism can be corrected just in accordance with the detection result. In other words, in accordance with this embodiment of the present invention, a simple and compact lens holding system can be accomplished by which, even for astigmatism of a projection optical system produced during the exposure process, it can be detected accurately and it can be corrected assuredly.

Next, referring to FIGS. 7 and 8, an embodiment of a device manufacturing method which uses an exposure apparatus such as shown in FIG. 1, will be explained.

Figure 7:
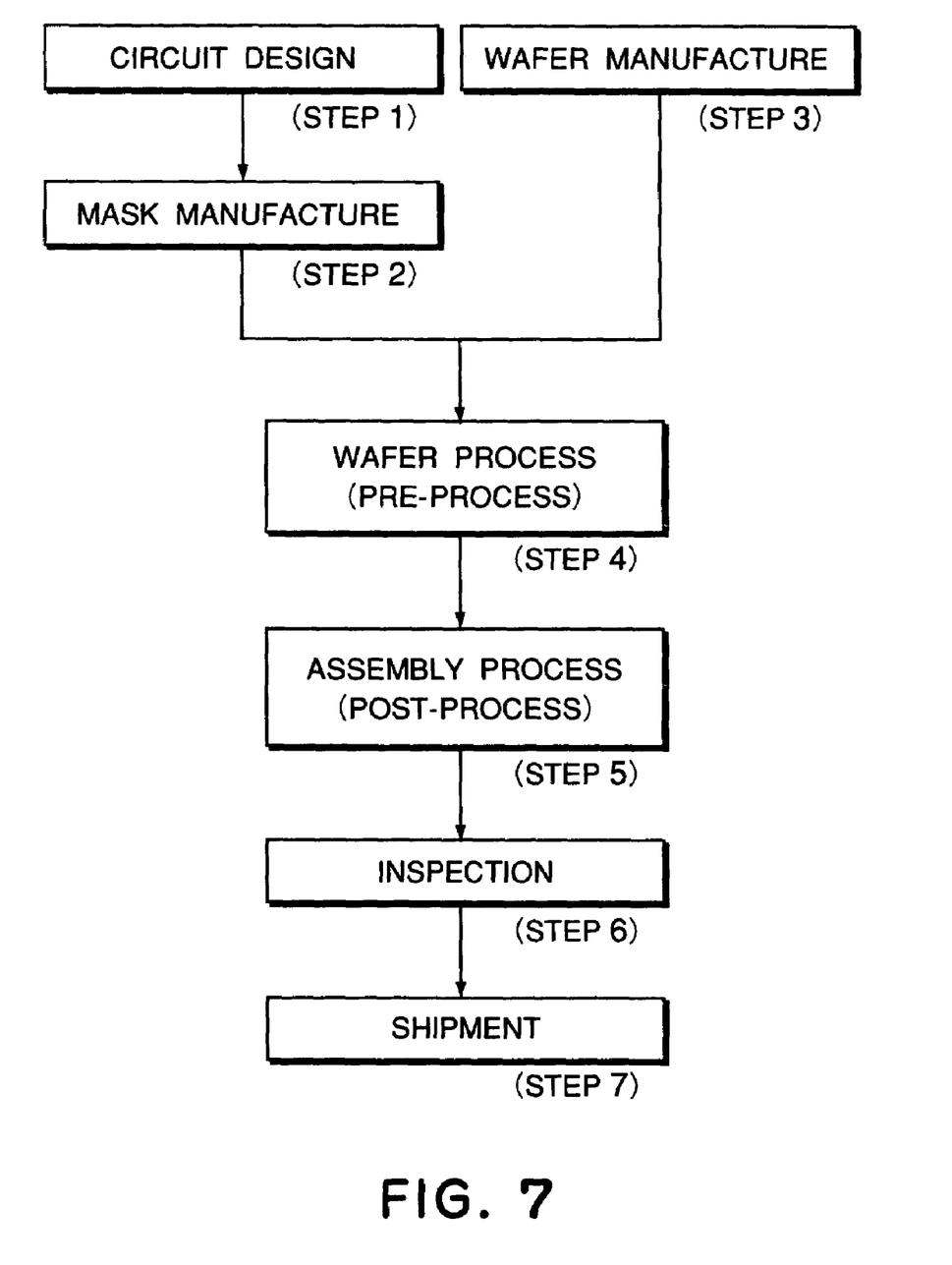
FIG. 7 is a flow chart for explaining the procedure for manufacturing devices such as semiconductor chips (IC or LSI, for example), LCD, or CCD, for example.

FIG. 7 is a flow chart for explaining the procedure of manufacturing various microdevices such as semiconductor chips (e.g., ICs or LSIs), liquid crystal panels, CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 8:
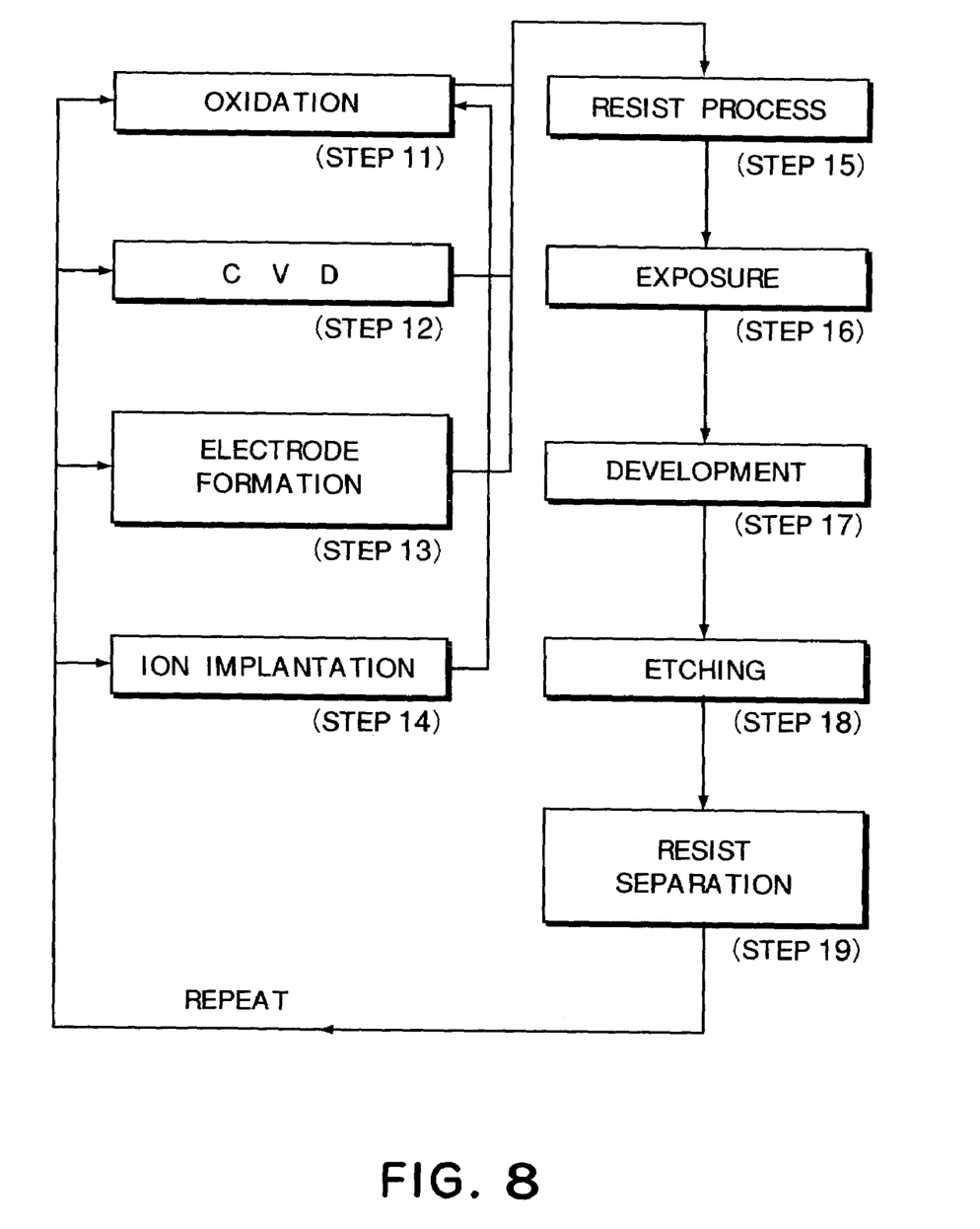
FIG. 8 is a flow chart for explaining details of a wafer process included in the procedure shown in FIG. 7.

FIG. 8 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

It is seen from the above that the present invention involves various other aspects which concern a device manufacturing method using an exposure apparatus such as described above and a device itself as a resultant of it.

In accordance with the embodiments of the present invention as described hereinbefore, a simple and compact optical element holding system in a projection exposure apparatus which enables, in regard to the astigmatism correction, assured correction of astigmatism without producing comatic aberration, can be accomplished. Also, an optical adjusting method using such holding system, an exposure apparatus having such holding system, exposure method and device manufacturing method based on such holding system, can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. An optical element holding system in a projection optical system, said optical element holding system comprising:
   two optical elements;
   relative angle adjusting means for tilting only one of said two optical elements with respect to an optical axis to adjust a relative angle between said two optical elements; and
   tilt amount adjusting means for tilting said two optical elements integrally with respect to the optical axis in a direction opposite to a direction of the tilt performed by said relative angle adjusting means.

2. An optical element holding system according to claim 1, further comprising a first holding member for holding one of said two optical elements and a second holding member for holding the other of said two optical elements, wherein said relative angle adjusting means serves to adjust a relative angle between said first holding member and said second holding member.

3. An optical element holding system according to claim 2, further comprising a third holding member for holding said first and second holding member, and a base member for supporting said third holding member, wherein said tilt amount adjusting means serves to tilt said third holding member relative to said base member.

4. An optical element holding system according to claim 2, wherein said first and second holding members hold respective optical elements at three substantially equiangular positions along an outer periphery of said respective optical elements, and wherein the holding positions of said first holding member are deviated by 60 degrees from those of said second holding member.

5. An optical element holding system according to claim 4, wherein the level of one of the three holding positions is made adjustable so as to tilt said optical element held by said first holding member relatively to said optical element held by said second holding member.

6. An optical element holding system according to claim 1, wherein said optical element holding system is mounted rotatably with respect to an optical axis of said projection optical system.

7. An optical element holding system according to claim 1, wherein said optical element holding system is mounted demountably with respect to the projection optical system.

8. An optical element holding system according to claim 1, wherein said two optical elements are two plane-parallel plate lens elements having substantially the same refractive index and thickness.

9. An optical element holding system according to claim 1, further comprising calculation means for calculating astigmatism of the projection optical system.

10. An exposure apparatus, comprising: a projection optical system which projects a pattern of a mask onto an object and includes an optical element holding system as recited in claim 1.

11. A device manufacturing method comprising steps of:
exposing an object by use of an exposure apparatus as recited in claim 10; and
developing the exposed object.

12. An optical adjusting method for adjusting a projection optical system including an optical element holding system which holds two optical elements, said method comprising:
a first tilting step for tilting only one of the two optical elements with respect to an optical axis to adjust a relative angle between the two optical elements; and
a second tilting step for tilting the two optical elements integrally with respect to the optical axis in a direction opposite to a direction of the tilt performed in said first tilting step.

13. A method according to claim 12, further comprising a step of calculating astigmatism of the projection optical system, wherein respective tilt angles in said first and second tilting steps are determined based on the calculated astigmatism.

14. An exposure method including a step of projecting a pattern of a mask onto an object via a projection optical system adjusted by an optical adjusting method as recited in claim 12.

15. A device manufacturing method comprising the steps of:
exposing an object by use of an exposure method as recited in claim 14; and
developing the exposed object.

16. An optical element holding system in a projection optical system, said optical element holding system comprising:
two optical elements;
a first tilt system which tilts only one of said two optical elements with respect to an optical axis to adjust a relative angle between said two optical elements; and
a second tilt system which tilts said two optical elements integrally with respect to the optical axis in a direction opposite to a direction of the tilt performed by said first tilt system.

17. An exposure apparatus comprising: a projection optical system which projects a pattern of a mask onto an object and includes an optical element holding system as recited in claim 16.

18. A device manufacturing method comprising the steps of:
exposing an object by use of an exposure apparatus as recited in claim 17; and
developing the exposed object.

* * * * *